(12) United States Patent
Chaney (10) Patent No.: US 9,212,785 B2
(45) Date of Patent: Dec. 15, 2015

(54) PASSIVE ISOLATION ASSEMBLY AND GAS TRANSPORT SYSTEM

(71) Applicant: Varian Semiconductor Equipment Associates, Inc., Gloucester, MA (US)

(72) Inventor: Craig R. Chaney, Lanesville, MA (US)

(73) Assignee: Varian Semiconductor Equipment Associates, Inc., Gloucester, MA (US)

( * ) Notice: Subject to any disclaimer, the term of this patent is extended or adjusted under 35 U.S.C. 154(b) by 514 days.

(21) Appl. No.: 13/649,733

(22) Filed: Oct. 11, 2012

(65) Prior Publication Data

US 2014/0102563 A1   Apr. 17, 2014

(51) Int. Cl.
*C23C 16/455* (2006.01)
*F17C 13/12* (2006.01)
*H05F 3/00* (2006.01)

(52) U.S. Cl.
CPC ............... *F17C 13/123* (2013.01); *F17C 13/12* (2013.01); *H05F 3/00* (2013.01); *C23C 16/455* (2013.01); *C23C 16/45561* (2013.01); *Y02E 60/34* (2013.01); *Y10T 137/8376* (2015.04)

(58) Field of Classification Search
CPC .......................... C23C 16/455; C23C 16/45561
USPC .......................................................... 118/715
See application file for complete search history.

(56) References Cited

U.S. PATENT DOCUMENTS

| | | | |
|---|---|---|---|
| 4,172,021 A | 10/1979 | Gladish | |
| 5,070,275 A | 12/1991 | Ibuka et al. | |
| 6,515,290 B1 | 2/2003 | Rzeszut et al. | |
| 6,746,566 B1 | 6/2004 | Olson et al. | |
| 7,321,125 B1 | 1/2008 | Olson et al. | |
| 8,587,202 B2 * | 11/2013 | Harmann et al. | 315/111.91 |
| 8,822,913 B2 * | 9/2014 | Graupera et al. | 250/281 |
| 2007/0044864 A1 | 3/2007 | Mathison et al. | |

FOREIGN PATENT DOCUMENTS

| | | |
|---|---|---|
| DE | 3122467 A1 | 5/1982 |
| DE | 41 16 066 A1 | 11/1992 |

(Continued)

OTHER PUBLICATIONS

Pye, J.W., A gas-phase high-voltage electrical isolator with controlled breakdown, Journal of Shysics E.: Scientific Instruments, 1978, pp. 825-829, vol. 11, The Institute of Physics, Great Britain.

(Continued)

*Primary Examiner* — John Fox (57) ABSTRACT

Disclosed are techniques to reduce the effects of Paschen events from occurring within a gas transport system. A passive isolation assembly may be used to bridge a gas being transported from a low potential environment to a high potential environment. The passive isolation assembly may include a non-conductive axially bored transport insulator. An irregularly shaped non-conductive isolation tracking insulator may be in direct contact with and surrounding the transport insulator. The passive isolation assembly may also include an electrically conductive front end sealing cap at earth ground potential that has an opening that is adapted to couple with a source gas transport line and an electrically conductive rear end sealing cap at a high voltage potential that has an opening adapted to couple with a destination gas transport line.

19 Claims, 4 Drawing Sheets

(56) References Cited

FOREIGN PATENT DOCUMENTS

| | | |
|---|---|---|
| DE | 100 55 104 C1 | 2/2002 |
| DE | 10 2007 049819 A1 | 4/2009 |

OTHER PUBLICATIONS

PCT International Search Report and Written Opinion, dated Mar. 6, 2014.

* cited by examiner

PASSIVE ISOLATION ASSEMBLY AND GAS TRANSPORT SYSTEM

BACKGROUND OF THE INVENTION

1. Field of the Invention

Embodiments of the invention relate to gas distribution systems. More particularly, the present invention relates to gas distribution systems that eliminate Paschen events or greatly reduce the effects of such Paschen events.

2. Discussion of Related Art

Transporting industrial gas(es) from a remote distribution box that is at earth ground (e.g., 0 V) to machinery utilizing the gas(es) in an environment that may be at a large voltage potential is a challenge. Safety is a paramount concern in toxic gas distribution. Gas leakage into the atmosphere may present a severe health risk to personnel working in the immediate environment. Any leakage must be limited to a parts per million (PPM) level. Another major concern in toxic gas distribution is bridging a high voltage potential between the source of the gas and its destination. The gas must be transported such that Paschen events are eliminated or the effects of Paschen events are greatly minimized.

It is with respect to these and other considerations that the embodiments described herein have been developed.

SUMMARY

This Summary is provided to introduce a selection of concepts in a simplified form that are further described below in the Detailed Description. This Summary is not intended to identify key features or essential features of the claimed subject matter, nor is it intended as an aid in determining the scope of the claimed subject matter.

Various embodiments are directed to reducing the effects of and/or eliminating Paschen events from occurring within a gas transport system. For example, a passive isolation assembly may be used to bridge a gas from a low potential environment at a first pressure to a high potential environment at a second pressure. The passive isolation assembly may include a non-conductive transport insulator constructed from an elongated rod having a central axial bore extending the length of the rod. A non-conductive isolation tracking insulator may be in direct contact with and surrounding the transport insulator. The isolation tracking insulator may have an irregular shape that increases the tracking length of the outside diameter of the isolation tracking insulator. The isolation tracking insulator may be made from a thermoplastic material. The passive isolation assembly may also include an electrically conductive front end sealing cap at earth ground potential that has an opening that is adapted to couple with a source gas transport line and an electrically conductive rear end sealing cap at a high voltage potential that has an opening adapted to couple with a destination gas transport line.

In other embodiments the passive isolation assembly is integrated into a larger gas transport system to safely bridge a transported gas from an earth ground potential environment to a high potential environment used by downstream equipment.

DESCRIPTION OF EMBODIMENTS

The present invention will now be described more fully hereinafter with reference to the accompanying drawings, in which preferred embodiments of the invention are shown. This invention, however, may be embodied in many different forms and should not be construed as limited to the embodiments set forth herein. Rather, these embodiments are provided so that this disclosure will be thorough and complete, and will fully convey the scope of the invention to those skilled in the art. In the drawings, like numbers refer to like elements throughout.

As earlier mentioned, safety is the pre-eminent concern when transporting toxic gases. This is especially true when the toxic gases may be transported from a source container at earth ground potential (i.e., 0 V) to machinery in an environment of significantly higher voltage potentials (e.g., 100 kV). The gas must be transported such that Paschen events are eliminated or the effects of Paschen events are greatly minimized. A Paschen event may be characterized as a chain reaction leading to an avalanche breakdown causing an arc to occur from a cascade of released electrons. Plasma may be formed by such an event. Formation of plasma can reduce the lifetime of the bridging components and lead to an excess current draw thereby limiting the capabilities of the bridging components.

Figure 1:
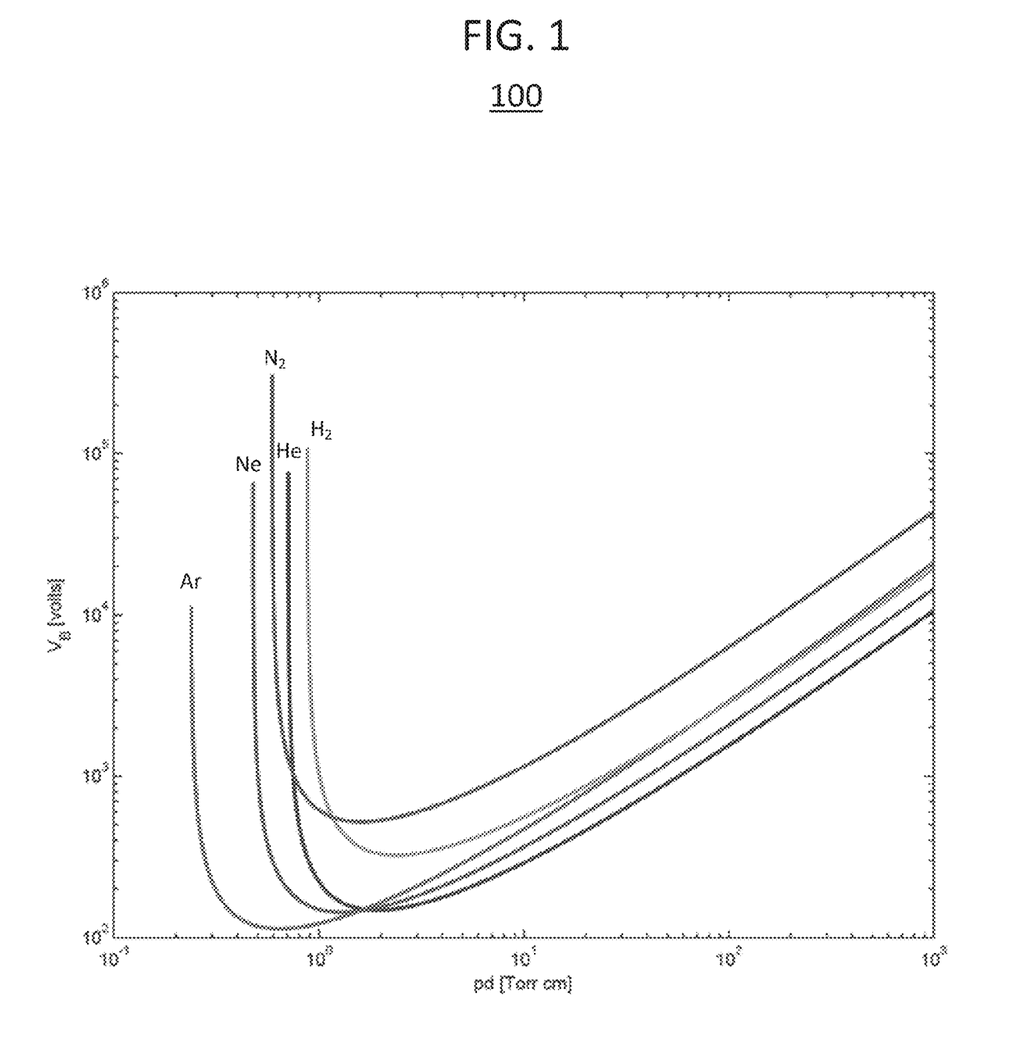
FIG. 1 illustrates an example of Paschen curves for various gases.

Paschen's law describes the breakdown voltage of gas between parallel plates as a function of pressure and gap distance. The voltage necessary to arc across the gap decreases up to a point as the pressure is reduced. The voltage then increases, gradually exceeding its original value. For normal pressure the voltage needed to cause an arc is reduced with the gap size, but only up to a point. As the gap is reduced further, the required voltage rises and again, exceeds its original value. This is illustrated in FIG. 1 in which the Paschen curves for the gases helium (He), neon (Ne), argon (Ar), hydrogen ($H_2$) and nitrogen ($N_2$) are illustrated as a function of voltage and pressure.

The mean free path of a molecule in a gas is the average distance between its collision with other molecules. This is inversely proportional to the pressure of the gas. In air the mean free path of molecules is about 96 nm at standard temperate. Since electrons are much smaller, the average distance between electrons colliding with molecules is about 5.64 times longer or about 0.5 µm. This is a substantial fraction of the 7.5 µm spacing between the electrodes for minimum arc voltage. If the electron is in an electric field of 43 MV/m, it will be accelerated and acquire 21.5 electron volts (eV) of energy in 0.5 µm of travel in the direction of the field. The first ionization energy needed to dislodge an electron from nitrogen, for example, is about 15 eV. The accelerated electron will acquire more than enough energy to ionize a nitrogen atom. This liberated electron will in turn be accelerated which will lead to another collision. A chain reaction then leads to avalanche breakdown and an arc occurs due to the cascade of released electrons.

More collisions will take place in the electron path between the electrodes in a higher pressure gas. When the pressure-gap product p*d is high, an electron will collide with many different gas molecules as it travels from cathode to anode. Each of the collisions randomizes the electron direction, so the electron is not always being accelerated by the electric field—sometimes it travels back towards the cathode and is decelerated by the field.

Collisions reduce the electron's energy and make it more difficult for the electron to ionize a molecule. Energy losses from a greater number of collisions therefore require larger voltages for the electrons to accumulate sufficient energy to ionize many gas molecules, which is required to produce an avalanche breakdown.

On the left side of the Paschen minimum in FIG. 1, the p*d product is small. The electron mean free path can become long compared to the gap between the electrodes. In this case, the electrons might gain lots of energy, but have fewer ionizing collisions. A greater voltage is therefore required to assure ionization of enough gas molecules to start an avalanche.

Different gases will have different mean free paths for molecules and electrons. This is because different molecules have different diameters. Noble gases like helium and argon are monoatomic and tend to have smaller diameters. This gives them a greater mean free path length. Ionization potentials differ between molecules as well as the speed that they recapture electrons after they have been knocked out of orbit. All three effects change the number of collisions needed to cause an exponential growth in free electrons necessary to cause an arc.

Gas Transport System

One goal in transporting gas that is sourced at earth ground potential and is destined for equipment at significantly higher voltage potentials is to safely bridge the gap between the different voltage potentials. This may be accomplished by ensuring the gas does not reach its breakdown voltage between the conductive ends of the bridging components based on the pressure and gap distance according to Paschen's law described above. If it does reach its breakdown voltage, ionization may occur and may lead to an avalanche condition that can destabilize the gas transport system, damage equipment, and endanger personnel in the vicinity.

Figure 2:
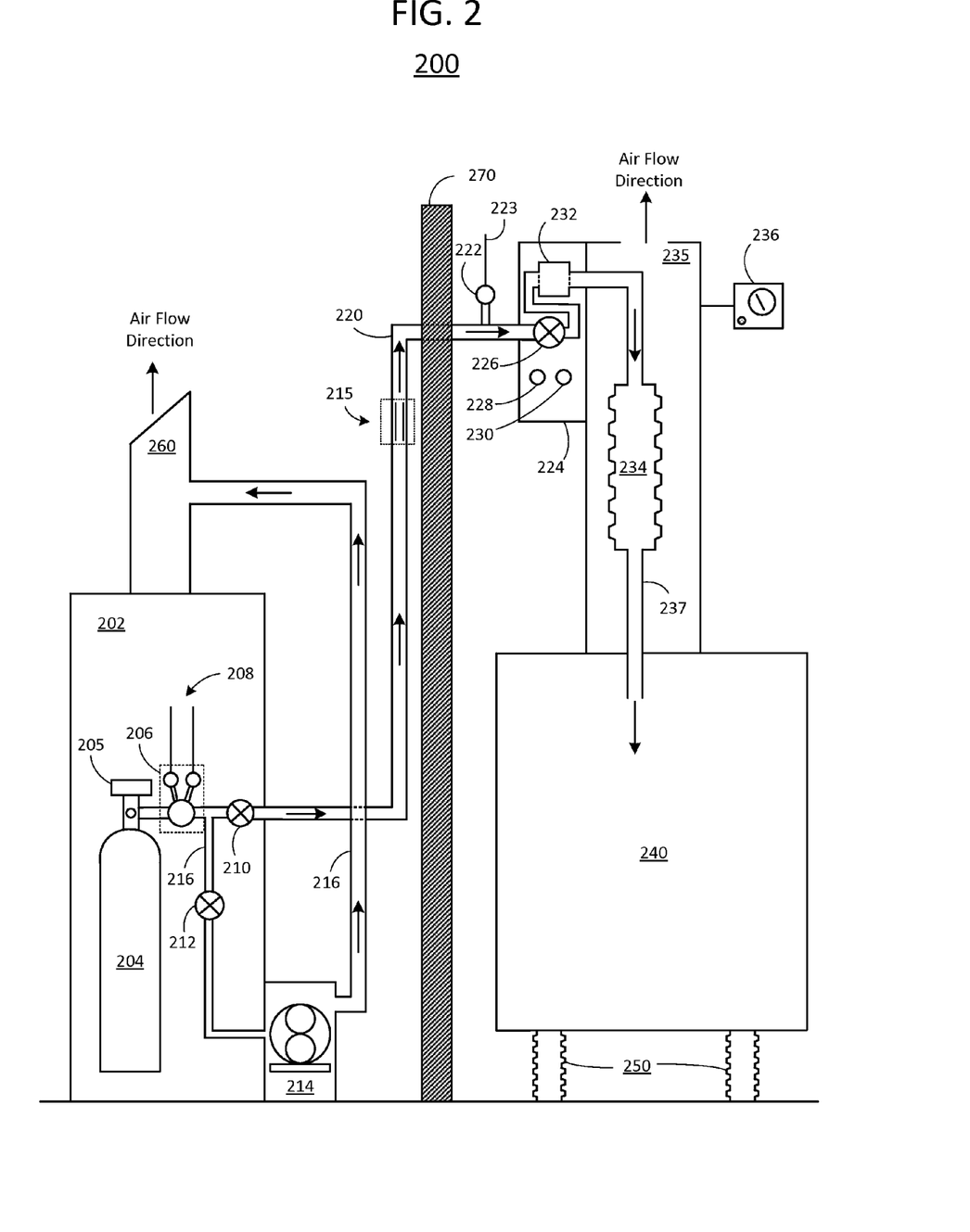
FIG. 2 illustrates an example of a gas transport system according to an embodiment of the present disclosure.

FIG. 2 illustrates an example of a gas transport system 200 according to an embodiment of the present disclosure. Although the gas transport system 200 shown in FIG. 2 has a limited number of elements in a certain topology, it may be appreciated that the gas transport system 200 may include more or less elements in alternate topologies as desired for a given implementation.

Figure 2A:
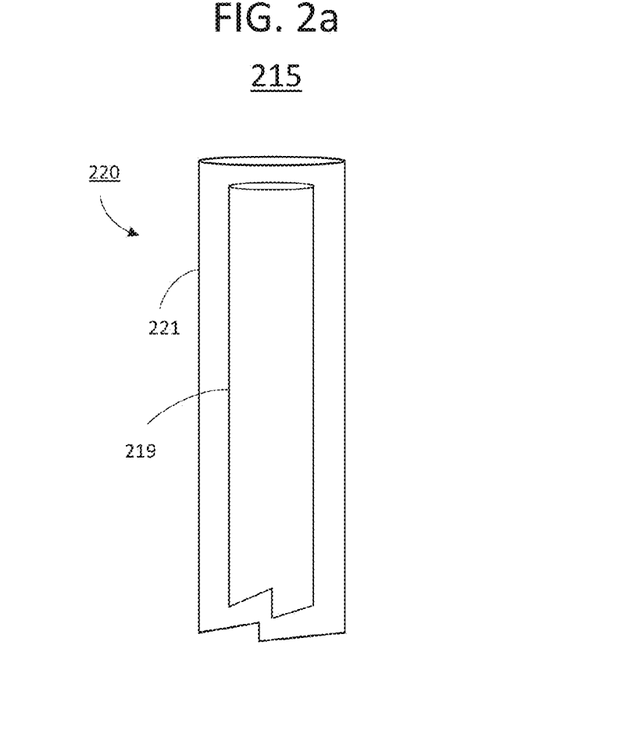
FIG. 2a is a more detailed illustration of a gas transport line according to an embodiment of the present disclosure.

The gas transport system 200 may originate at a source. The source in this example is a sealed gas box container 202 that houses a gas tank 204. The gas tank 204 includes a manual gas bottle valve installed in the gas cylinder and a coupling 205 that connects to a gas transport line 220. The source gas transport line 220 may be comprised of, for example, a double walled stainless steel structure. FIG. 2a illustrates the boxed section 215 in FIG. 2 that further illustrates the gas transport line 220. The source gas transport line 220 may comprise two separate tubes in which an inner tube 219 carries the gas from gas tank 204 and an outer tube 221 carries an inert gas such as nitrogen. The gas transport line 220 starts at the outside of the gas box container 202 and terminates at a control box 224. The double walled gas transport line 220 may be filled via a T-fitting installed in the outer tube 221. The T-fitting may include a pressure gauge/transducer 222 to monitor pressure both visually and via electronics 223. The outer tube 221 of the double walled gas transport line 220 may be filled with a pre-determined pressure of nitrogen ($N_2$) gas and monitored.

Alternatively, the gas may be sent directly from a remote location via a double walled gas transport line 220 to a remote gas box which then regulates the gas pressure. In such an embodiment, no bottle would be present in the gas box container 202.

Upon leaving the gas tank 204, the source gas transport line 220 encounters a regulator 206 before diverging into two paths, a main path (i.e., a continuation of the gas transport line 220) and an evacuation path 216. Regulator 206 monitors the pressure within the inner tube 219 and the outer tube 221 and relays information over electrical lines 208 to the remote control box 224. The source gas transport line 220 also includes a shut-off valve 210 capable of closing the source gas transport line 220 to prevent gas from traveling past the shut-off valve 210. Similarly, the evacuation path 216 includes a shut-off valve 212 capable of closing the source gas transport line 220 to prevent gas from traveling past the shut-off valve 212. In normal operation, shut-off valve 212 within evacuation path 216 remains closed. In emergency or leakage situations, shut-off valve 212 within evacuation path 216 will open and shut-off valve 210 within source gas transport line 220 will close. Gas tank 204 will be turned off and residual gas will be shunted to a roughing pump 216 and safely evacuated out through an exhaust system 228.

Otherwise, gas will continue to be transported through source gas transport line 220 towards its destination. This can include having the source gas transport line 220 go through a building or wall structure 270 before arriving at a control box 224. Prior to reaching the control box 224, a pressure gauge/transducer 222 may be placed in the line to measure the nitrogen pressure in the gas transport line 220. The pressure reading is forwarded via an electrical line 223 to the control box 224. The source gas transport line 220 then enters control box 224. The control box 224 may include multiple components including, but not limited to, another shut-off valve 226, pressure transducers 228, 230, and a flow meter 232. The shut-off valve 226 may be controlled to open and close based on the current status or state of the system. The pressure transducers are safety transducers operative to monitor for pressure leakage. The flow meter 232 is operative to measure the amount of gas currently flowing through the gas transport line 220.

Upon leaving the control box 224, the source gas transport line 220 enters an exhaust area 235 that includes a passive isolation assembly 234. The exhaust area 235 may be monitored by a manometer 236 that measures the pressure in the exhaust area 235. Manometer 236 readings may be forwarded to control box 224. The passive isolation assembly 234 receives gas from the source gas transport line 220 at one pressure and at earth ground potential and acts as a bridging component to safely allow gas to exit the passive isolation assembly 234 at a different pressure and in an environment of significantly higher voltage potential. The different pressure may be higher or lower depending upon the gas species being transported.

The gas that has been safely bridged into this new environment may then be distributed to equipment 240 via destination gas transport line 237 that uses the gas such as, for instance, an ion implantation system. The equipment may be housed in a structure that is supported by one or more porcelain insulators 250 to keep the equipment at the desired potential rather than creating a short to earth ground.

Passive Isolation Assembly

Figure 3:
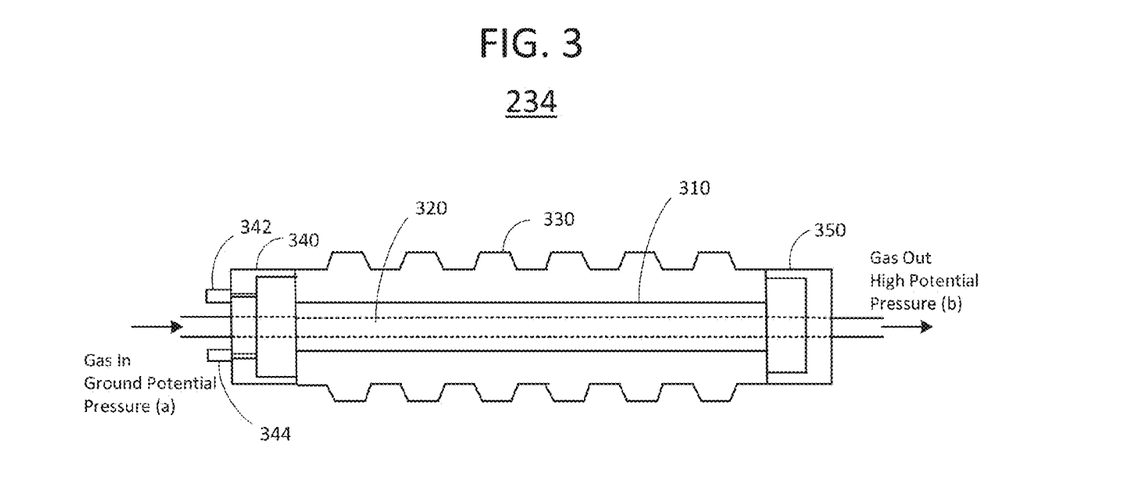
FIG. 3 illustrates an example of a passive isolation assembly according to an embodiment of the present disclosure.

FIG. 3 illustrates an example of a passive isolation assembly 234 according to an embodiment of the present disclosure. The passive isolation assembly 234 may be comprised of a non-conductive transport insulator 310 that may be in the shape of an elongated rod that includes a full length axial bore 320 that effectively creates a tube. The transport insulator 310 may be comprised of quartz or other non-conductive materials such as, but not limited to, borosilicate or glass. The material of the transport insulator should be able to withstand pressure changes from, for example, 60 torr to (3500+) pounds per square inch (psi).

A torr is a non-SI unit of pressure with the ratio of 760 to 1 standard atmosphere, chosen to be roughly equal to the fluid pressure exerted by a millimeter of mercury (i.e., a pressure of 1 torr is approximately equal to one millimeter of mercury). For reference purposes, 1 torr is equivalent to 0.01933 psi so 60 torr is equivalent to approximately 1.159 psi.

The transport insulator 310 is in direct contact with an isolation tracking insulator 330 comprised of a thermoplastic material. A thermoplastic is a polymer that becomes pliable or moldable above a specific temperature, and returns to a solid state upon cooling. Most thermoplastics are characterized by their heat resistance, solvent resistance and flame resistance. In addition, thermoplastics also have a high dielectric strength. Examples of usable thermoplastics for isolation tracking insulator 330 include, but are not limited to, polyetherimide (PEI), polyether ether ketone (PEEK), and chlorinated polyvinyl chloride (CPVC).

The transport insulator 310 is surrounded by the isolation tracking insulator 330 and sealed by an electrically conductive front end sealing cap 340 and an electrically conductive rear end sealing cap 350 on each end. The front end sealing cap 340 and the rear end sealing cap 350 may be made from stainless steel or another conductive material.

The isolation tracking insulator 330 has an irregular shape that increases the tracking length of its outside diameter. The length along the outside surface determines the maximum voltage standoff capability. The typical voltage standoff capability may be 10 kv per inch. Thus, increasing the length by using an irregular shape comprised of "convolutions" increases this length and increases the overall voltage standoff capability.

Figure 4:
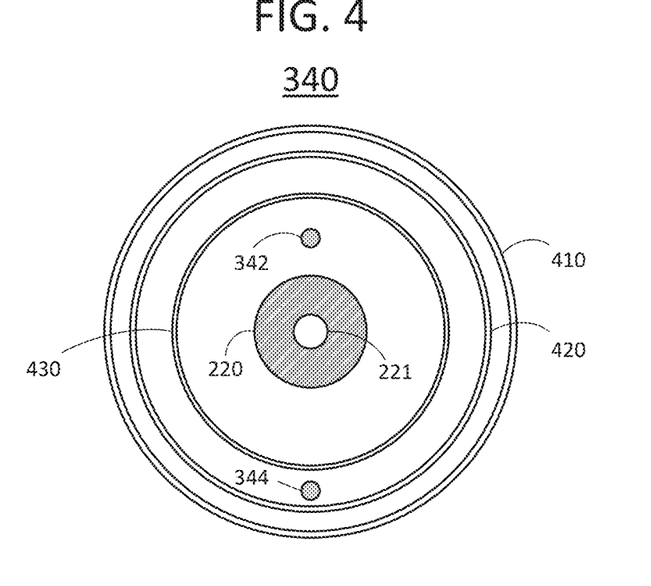
FIG. 4 illustrates a cross-sectional view of a front end sealing cap according to embodiment of the present disclosure.

FIG. 4 illustrates a cross-sectional view of a front end sealing cap 340 according to embodiment of the present disclosure. The front end sealing cap 340 is maintained at earth ground potential in its operative coupling with the conductive source gas transport line 220 which is also at earth ground potential. The front end sealing cap 340 may receive gas via gas transport line 220 and allow it to pass into the transport insulator 310 that is surrounded by the isolation tracking insulator 330. The front end sealing cap 340 may include one or more monitoring switches or transducers that can detect any gas leakage within the front end sealing cap 340. A first transducer may be referred to as a warning transducer 342 while a second transducer may be referred to as a fail-safe transducer 344. The warning transducer 342 and the fail-safe transducer 344 ensure safe operating conditions. In the event of a leak from the center transport tube the warning transducer 342 may provide a software alert within the control box 224. Software executing in the control box 224 may be controlled and displayed for a technician in a remote location. A technician may observe an alert caused by a leak sensed by the warning transducer 342. The technician may respond to the alert causing a service call. If the leak is detected by the fail-safe transducer 344, the software may automatically initiate a routine to protect the equipment and personnel by evacuating the transport gas in a safe manner. A warning may also be displayed on the equipment.

The front end sealing cap 340 may be structured in a multiple redundant seal arrangement that increases the pressure capability in case of a rupture. For example, an outer seal 410 may be the outer casing of the front end sealing cap 340. The middle seal 420 may be an O-ring and double Parbak™ ring seal arrangement. The inner seal 430 may also be an O-ring and double Parbak™ ring seal arrangement. Parbak™ is a standard rubber back-up ring of contoured design manufactured and distributed by the Parker Hannifin Corp. Parbak™ rings are intended for use in dynamic and static seal applications. In double acting seal arrangements, a Parbak™ ring is placed on both sides of an O-ring. By specifying a Parbak™ ring on each side of the O-ring, there will be one on the low pressure side, where it is needed, and the extra Parbak™ ring does no harm. Besides their advantages as anti-extrusion devices, Parbak™ rings help trap lubricant, preserving the O-ring and reducing friction. The embodiments are not limited to this example.

The warning transducer 342 may be positioned between the inner seal 430 and the gas transport line 220. The fail-safe transducer 344 may be positioned between the inner seal 430 and the middle seal 420. The warning transducer 342 will trigger before the fail-safe transducer 344 since it is closer to the gas transport line and will detect a change in pressure before the fail-safe transducer 344. A more sever rupture may also trigger the fail-safe transducer 344. If either of the transducers 342, 344 are relay readings above the safety threshold, the control box 224 can take immediate preventive action by closing all relevant shut-off valves to prevent any additional gas from leaking. The embodiments are not limited to this example.

Figure 5:
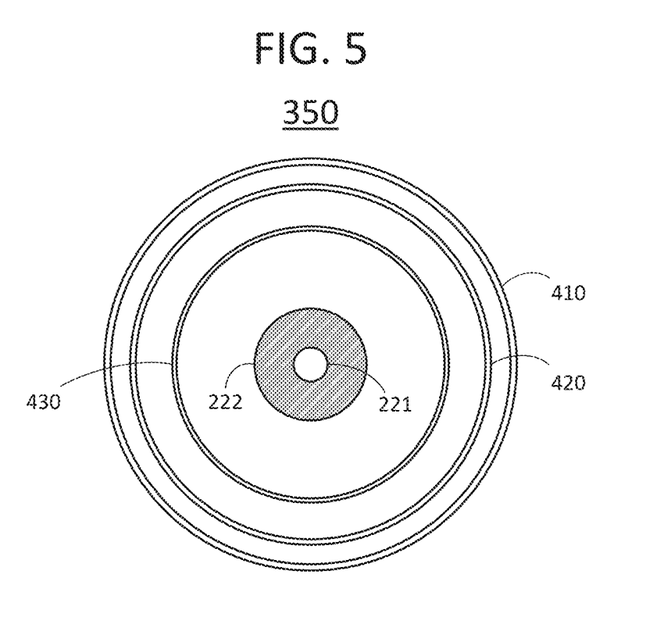
FIG. 5 illustrates a cross-sectional view of a rear end sealing cap according to embodiment of the present disclosure.

FIG. 5 illustrates a cross-sectional view of a rear end sealing cap 350 according to embodiment of the present disclosure. The rear end sealing cap 350 is maintained at a higher potential due to its operative coupling with a conductive destination gas transport line 237 which is at the higher potential. Just as for the front end sealing cap 340, the rear end sealing cap 350 may be structured in a multiple redundant seal arrangement that increases the pressure capability in case of a rupture. For example, an outer seal 410 may be the outer casing of the rear end sealing cap 350. The middle seal 420 may be a standard O-ring. The inner seal 430 may be an O-ring and double Parbak™ ring seal arrangement.

The gas transport system 200 is operative to transport a gas, typically for an industrial use, over a distance from a source container like gas tank 204 to destination equipment over a considerable distance. Moreover, at some point, the source gas transport line 220 will switch from an earth ground potential to a higher voltage potential environment. In addition to the normal hazards associated with transporting gas, bridging this voltage potential can be dangerous. In operation, the gas transport system 200 may include multiple redundant safety devices and controls to ensure that any leakage is detected as quickly as possible and handled accordingly. For instance, the source gas transport line 220 may be a double walled stainless steel configuration in which the tube defined by the inner wall carries the gas and the tube defined by the outer wall that surrounds the tube the defined by the inner wall carries nitrogen. For example, the gap between the inner diameter of the outer tube 221 and the outer diameter of the inner tube 219 may be filled with nitrogen, capped and monitored by use of a pressure gauge/transducer 222 that may present both visual and electronic feedback. In the event of a rupture both at negative pressure and positive pressure the pressure gauge/transducer 222 may sense a pressure change and alert the software of a potential issue.

A regulator 206 monitors the pressure in each of the gas and nitrogen tubes and is electrically coupled via electrical lines 208 to the control box 224. Multiple shut-off valves 210, 226, a nitrogen pressure monitoring gauge 222, pressure transducers 228, 230, and a flow meter 232 are controllable by the control box to close off the source gas transport line 220 upon detection of a leak. An evacuation path 216 and shut-off valve 212 can shunt the direction of the source gas transport line 220 to a roughing pump 214 and safely out an exhaust system 260 in the event of a leak.

During normal operation, a gas transported through the source gas transport line 220 will reach the passive isolation assembly 234 via a coupling between the source gas transport line 220 and the front end sealing cap 340 of the passive isolation assembly 234. Both the source gas transport line 220 and the front end sealing cap 340 are conductive and at earth ground potential. The passive isolation assembly 234 also includes a rear end sealing cap 350 that is conductive and at a higher potential. A non-conductive transport insulator 310 carries the gas across the gap between the front and rear end sealing caps that are at different voltage potentials. The transport insulator 310 is surrounded by the irregularly shaped thermoplastic isolation tracking insulator 320. The passive isolation assembly 234 serves to safely bridge the gas from the earth ground potential source side to the high voltage potential equipment side of the gas transport system 200 in an environment free of Paschen events.

The embodiments described herein provide several advantages over current techniques. For example, the embodiments described herein can safely bridge both inert and toxic gases from earth ground potential to a potential of 100 kV or higher without concern of a Paschen event occurring. Thus, the techniques and devices described herein are ideal for equipment and applications that utilize high voltage sources and wish to reduce down time attributable to excessive local gas tank changes. This is because the techniques and devices described herein may be used with a larger centralized gas transport system and do not rely on the presence of local gas tanks throughout the work space. This both creates additional work space and significantly enhances safety by avoiding numerous gas tank changes in a closed environment. The multiple redundant safety shut-off valves and evacuation paths throughout the entirety of the gas transport system further provide enhanced safety to personnel.

This is in contrast to previous techniques including the aforementioned multiple local gas tanks requiring multiple gas tank changes to keep equipment running Every time a gas tank is changed there is an element of danger introduced into the work area. Other attempts at bridging a low to high potential gap have involved using much higher pressures which can be dangerous. Other techniques introduce foreign media in the gas stream gap between the low and high potentials which may have the effect of reducing the distance of acceleration but may not prevent a Paschen event and an avalanche breakdown.

While the present invention has been disclosed with reference to certain embodiments, numerous modifications, alterations and changes to the described embodiments are possible without departing from the sphere and scope of the present invention, as defined in the appended claims. Accordingly, it is intended that the present invention not be limited to the described embodiments, but that it has the full scope defined by the language of the following claims, and equivalents thereof.

What is claimed is:

1. A passive isolation assembly to bridge a gas from a low potential environment at a first pressure to a high potential environment at a second pressure, the assembly comprising:
   a non-conductive transport insulator comprised of an elongated rod having a central axial bore extending the length of the rod;
   a non-conductive isolation tracking insulator in direct contact with and surrounding the transport insulator, the isolation tracking insulator having an irregular shape that increases the tracking length of the outside diameter of the isolation tracking insulator;
   an electrically conductive front end sealing cap at earth ground potential, the front end sealing cap having an opening adapted to couple with a source gas transport line; and
   an electrically conductive rear end sealing cap at a high voltage potential, the rear end sealing cap having an opening adapted to couple with a destination gas transport line, wherein the distance from the front end sealing cap to the rear end sealing cap defines a gap between conductors at different voltage potentials that a gas may flow across via the axial bore of the transport insulator.

2. The passive isolation assembly of claim 1, the transport insulator capable of withstanding pressures between 60 torr and 3500+ psi without rupturing.

3. The passive isolation assembly of claim 1, in which the transport insulator is quartz.

4. The passive isolation assembly of claim 3, in which the transport insulator is borosilicate.

5. The passive isolation assembly of claim 3, in which the transport insulator is glass.

6. The passive isolation assembly of claim 1, in which the isolation tracking insulator is a thermoplastic material.

7. The passive isolation assembly of claim 6, in which the thermoplastic material is polyetherimide (PEI).

8. The passive isolation assembly of claim 6, in which the thermoplastic material is polyether ether ketone (PEEK).

9. The passive isolation assembly of claim 6, in which the thermoplastic material is chlorinated polyvinyl chloride (CPVC).

10. The passive isolation assembly of claim 1, in which the conductive material of the front end sealing cap and the rear end sealing cap is stainless steel.

11. The passive isolation assembly of claim 10, the front end sealing cap and rear end sealing cap further comprising multiple sealed walled chambers.

12. The passive isolation assembly of claim 1, the front end sealing cap further comprising one or more pressure transducers to measure pressure within the front end sealing cap.

13. A gas transport system to bridge a gas from a low potential environment at a first pressure to a high potential environment at a second pressure, the gas transport system comprising:
   a conductive source gas transport line coupled between the source gas tank and the passive isolation assembly at the end of the passive isolation assembly at earth ground potential;
   a conductive destination gas transport line coupled with the passive isolation assembly at the end of the passive isolation assembly at the higher potential;
   a non-conductive transport insulator comprised of an elongated rod having a central axial bore extending a length of the rod;
   a non-conductive isolation tracking insulator in direct contact with and surrounding the transport insulator, the isolation tracking insulator having an irregular shape that increases the tracking length of the outside diameter of the isolation tracking insulator;

an electrically conductive front end sealing cap at earth ground potential, the front end sealing cap having an opening adapted to couple with the conductive source gas transport line; and an electrically conductive rear end sealing cap at a high voltage potential, the rear end sealing cap having an opening adapted to couple with the destination gas transport line, wherein the distance from the front end sealing cap to the rear end sealing cap defines a gap between conductors at different voltage potentials that a gas may flow across via the axial bore of the non-conductive transport insulator.

14. The gas transport system of claim 13, the passive isolation assembly comprising:

a source gas tank at earth ground potential;

a control box to monitor and control the flow of gas throughout the gas transport system; and a passive isolation assembly having opposite ends to permit the flow of gas from a conductive point on one end at earth ground potential to a conductive point on the other end at a higher voltage potential.

15. The gas transport system of claim 14, in which the isolation tracking insulator is a thermoplastic material comprised of one of the following: polyetherimide (PEI), polyether ether ketone (PEEK), or chlorinated polyvinyl chloride (CPVC).

16. The gas transport system of claim 14, the non-conductive transport insulator capable of withstanding pressures between 60 torr and 3500+ psi without rupturing.

17. The gas transport system of claim 13, the electrically conductive front end sealing cap and electrically conductive rear end sealing cap further comprising multiple sealed walled chambers.

18. The gas transport system of claim 13, the electrically conductive front end sealing cap further comprising one or more pressure transducers to measure pressure within the front end sealing cap.

19. A gas transport system to bridge a gas from a low potential environment at a first pressure to a high potential environment at a second pressure, the gas transport system comprising:

a source gas tank at earth ground potential;

a control box to monitor and control the flow of gas throughout the gas transport system;

a passive isolation assembly having opposite ends to permit the flow of gas from a conductive point on one end at earth ground potential to a conductive point on the other end at a higher voltage potential;

a conductive source gas transport line coupled between the source gas tank and the passive isolation assembly at the end of the passive isolation assembly at earth ground potential;

a conductive destination gas transport line coupled with the passive isolation assembly at the end of the passive isolation assembly at the higher potential;

a non-conductive transport insulator comprised of an elongated rod having a central axial bore extending the length of the rod;

an isolation tracking insulator in direct contact with and surrounding the non-conductive transport insulator, the isolation tracking insulator having an irregular shape that increases the tracking length of the outside diameter of the isolation tracking insulator;

an electrically conductive front end sealing cap at earth ground potential, the front end sealing cap having an opening adapted to couple with the source gas transport line; and an electrically conductive rear end sealing cap at a high voltage potential, the rear end sealing cap having an opening adapted to couple with the destination gas transport line.

* * * * *